(12) United States Patent
Zhao et al.

(10) Patent No.: US 12,222,369 B2
(45) Date of Patent: Feb. 11, 2025

(54) MEMS PROBE CARD

(71) Applicant: MAXONE SEMICONDUCTOR CO., LTD., Jiangsu (CN)

(72) Inventors: Liangyu Zhao, Suzhou (CN); Ailin Wang, Suzhou (CN)

(73) Assignee: MAXONE SEMICONDUCTOR CO., LTD., Suzhou (CN)

( * ) Notice: Subject to any disclaimer, the term of this patent is extended or adjusted under 35 U.S.C. 154(b) by 124 days.

(21) Appl. No.: 18/021,244

(22) PCT Filed: Jul. 27, 2021

(86) PCT No.: PCT/CN2021/108720
§ 371 (c)(1),
(2) Date: Feb. 14, 2023

(87) PCT Pub. No.: WO2022/033300
PCT Pub. Date: Feb. 17, 2022

(65) Prior Publication Data
US 2023/0324437 A1    Oct. 12, 2023

(30) Foreign Application Priority Data
Aug. 14, 2020 (CN) .......................... 202010816387.3

(51) Int. Cl.
*G01R 31/20* (2006.01)
*G01R 1/073* (2006.01)

(52) U.S. Cl.
CPC ................ *G01R 1/07342* (2013.01)

(58) Field of Classification Search
CPC ............ G01R 1/07314; G01R 1/07342; G01R 1/07378; G01R 1/06711; G01R 1/06738;
(Continued)

(56) References Cited

U.S. PATENT DOCUMENTS

| 2010/0053601 A1* | 3/2010 | Osawa | G01M 11/0257 356/124.5 |
| 2010/0066393 A1* | 3/2010 | Bottoms | G01R 1/06711 324/755.05 |

(Continued)

FOREIGN PATENT DOCUMENTS

| CN | 1431693 A | 7/2003 |
| CN | 1623094 A | 6/2005 |

(Continued)

OTHER PUBLICATIONS

Oct. 14, 2021 Search Report issued in International Patent Application No. PCT/CN2021/108720.

*Primary Examiner* — Thang X Le
(74) *Attorney, Agent, or Firm* — Oliff PLC

(57) ABSTRACT

The MEMS probe card of the invention belongs to the technical field of IC manufacturing industry, and specifically relates to the manufacturing of micro-electromechanical systems, testing of semiconductor bare chip and related key technologies; From top to bottom, the probe card comprises a stiffener, a PCB board, an adapter layer, a guide plate and a MEMS probe; the invention not only discloses a MEMS probe card, but also discloses a new manufacturing process of a MEMS probe card, including the structure of MEMS probe card, the etching equipment and method of guide plate-MEMS probe structure template, the probe positioning method of etching the guide plate-MEMS probe structure template, the manufacturing method of the guide plate-MEMS probe structure and the docking device and method of the guide plate-MEMS probe structure and the adapter layer to finally realize the manufacturing of a submicron-sized MEMS probe card.

1 Claim, 6 Drawing Sheets

(58) Field of Classification Search
CPC ............ G01R 1/06772; G01R 31/2886; G01R 31/2889
See application file for complete search history.

(56) References Cited

U.S. PATENT DOCUMENTS

| | | | | |
|---|---|---|---|---|
| 2010/0164526 | A1* | 7/2010 | Pagani | G01R 1/06733 324/756.03 |
| 2010/0308855 | A1* | 12/2010 | Pagani | G01R 1/0491 324/756.03 |
| 2012/0194211 | A1* | 8/2012 | Osawa | G01M 11/0257 324/755.07 |
| 2017/0139003 | A1* | 5/2017 | Dengler | G01R 1/06794 |
| 2021/0172978 | A1* | 6/2021 | Funatoko | G01R 1/07392 |

FOREIGN PATENT DOCUMENTS

| | | |
|---|---|---|
| CN | 101069277 A | 11/2007 |
| CN | 101113990 A | 1/2008 |
| CN | 101142487 A | 3/2008 |
| CN | 101164152 A | 4/2008 |
| CN | 101221195 A | 7/2008 |
| CN | 101233610 A | 7/2008 |
| CN | 101258410 A | 9/2008 |
| CN | 101303371 A | 11/2008 |
| CN | 101414569 A | 4/2009 |
| CN | 101470136 A | 7/2009 |
| CN | 101545927 A | 9/2009 |
| CN | 101762723 A | 6/2010 |
| CN | 102121944 A | 7/2011 |
| CN | 102221636 A | 10/2011 |
| CN | 102288793 A | 12/2011 |
| CN | 102384992 A | 3/2012 |
| CN | 202837352 U | 3/2013 |
| CN | 103675369 A | 3/2014 |
| CN | 104237578 A | 12/2014 |
| CN | 104345187 A | 2/2015 |
| CN | 105486892 A | 4/2016 |
| CN | 106885928 A | 6/2017 |
| CN | 107422197 A | 12/2017 |
| CN | 108710010 A | 10/2018 |
| CN | 108957057 A | 12/2018 |
| CN | 109425764 A | 3/2019 |
| CN | 110501539 A | 11/2019 |
| CN | 110531125 A | 12/2019 |
| CN | 110612452 A | 12/2019 |
| CN | 111103445 A | 5/2020 |
| CN | 111766413 A | 10/2020 |
| CN | 111766414 A | 10/2020 |
| CN | 111766415 A | 10/2020 |
| CN | 111766416 A | 10/2020 |
| CN | 111766417 A | 10/2020 |
| CN | 111766418 A | 10/2020 |
| CN | 111983272 A | 11/2020 |
| EP | 2 204 656 A1 | 7/2010 |

* cited by examiner

MEMS PROBE CARD

TECHNICAL FIELD

The MEMS probe card of the invention belongs to the technical field of IC manufacturing industry, and specifically relates to the manufacturing of micro-electromechanical systems, testing of semiconductor bare chip and related key technologies.

BACKGROUND OF INVENTION

Probe card is a very important technology in the process of chip manufacturing. Before the chip is packaged, the probe on the probe card directly contacts with the welding pad or bump on the chip to lead out the chip signals and realize automatic measurement with associated testing instruments and software control, so as to screen out defective products and ensure product yield.

With the development of micro-electromechanical system (MEMS) technology, the dimension of the chip is getting smaller and smaller, reaching the millimeter level, while the internal integration of the chip is getting higher and higher, reaching the micron level, or even the submicron level, which requires the dimension of the probe card to be reduced synchronously with the probe, thus making the probe manufacturing face new challenges.

With regard to the manufacturing of probe cards, many existing technologies have been disclosed. The disclosed technologies are included as follows in the chronological order:

02100980.5 Wafer level probe card and its manufacturing method 03802632.5 Probe card and the manufacturing method of probe card 200580041495.1 Manufacturing method of probe card including detection probe 200580049139.4 Probe card and its manufacturing method 200680009115.0 Probe card and its manufacturing method 200680027726.8 Method and device for manufacturing probe card 200680031627.7 Probe card and its manufacturing method 200610103270.0 Manufacturing method of probe card 200710110928.5 Probe card for testing and its manufacturing method 200710162691.5 Manufacturing method, structure of a conductive film and a probe card having the conductive film 200710306120.4 Manufacturing method of probe card 200810088590.2 Manufacturing method and device of probe card 200810099307.6 Probe card and its manufacturing method 200910207279.X Manufacturing method of probe card including detection probe and probe card and probe card inspection system 201010000429.2 A micro-probe structure and its manufacturing method 201010551930.8 A probe card and its manufacturing method and method for testing semiconductor components 201010602334.8 Probe card structure and its assembly method 201110229503.2 Probe card and its manufacturing method 201220520534.3 Probe card mounting platform and probe testing device 201310303035.8 Probe card and its manufacturing method 201410262345.4 Probe card and its manufacturing method 201410328012.7 Plate for probe card and its manufacturing method and probe card 201510543596.4 Integrated circuit probe card, manufacturing method, detection probe card device and method 201510929670.6 Probe card and its manufacturing method 201710242941.X Guide plate for probe card and method for manufacturing guide plate for probe card 201711042258.8 Probe for probe card and its manufacturing method 201810863816.5 Probe card, test device including the probe card and related manufacturing method 201810871834.8 Manufacturing method of vertical probe card and silicon substrate structure 201880030578.8 Manufacturing method of multilayer structure of probe card for testing equipment of electronic devices 201910435481.1 Space converter, probe card and its manufacturing method 201910781444.6 Equipment and use method for manufacturing, testing and maintenance of probe card 201911021188.7 Guide plate for probe card, its manufacturing method, and probe card with the guide plate It can be seen that from the beginning of the new century to the present, scholars and major enterprises of all countries have made bold attempts and innovations in the production of probe cards, striving to follow the development of semiconductor technologies and meet the testing requirements of semiconductor devices.

Among these technologies, some are used to manufacture probe cards with larger dimensions, and some are used to avoid burning the probes during the testing. Although there are also technologies used to manufacture probe cards with higher integration, it is still impossible to realize the manufacturing of probe cards with submicron-sized probes. The reason is that for the submicron-sized probe, the bending of the probe cannot be effectively avoided during the manufacturing process. Once the probe is slightly bent, it will contact another probe with the submicron-sized distance away, causing the manufacturing failure.

DISCLOSURE OF THE INVENTION

For the manufacturing requirements of a submicron-sized probe card, the invention discloses a MEMS probe card and it also includes a new manufacturing process of a MEMS probe card, including the structure of MEMS probe card, the etching equipment and method of guide plate-MEMS probe structure template, the probe positioning method of etching the guide plate-MEMS probe structure template, the manufacturing method of the guide plate-MEMS probe structure and the docking device and method of the guide plate-MEMS probe structure and the adapter layer to finally realize the manufacturing of a submicron-sized MEMS probe card.

The purpose of the invention is achieved in this way:

From top to bottom, the MEMS probe card comprises a stiffener, a PCB board, an adapter layer, a guide plate and a MEMS probe; the stiffener is used to increase the strength of MEMS probe card; the PCB board is used to connect the testing machine and signal line; the adapter layer is a medium between a PCB board and a MEMS probe for realizing a fixed adaptation of signals; the guide plate is used to accommodate a MEMS probe; and the MEMS probe is used to connect the tested wafer to realize the testing of the electrical properties of the wafer;

The guide plate and the MEMS probe jointly constitute a guide plate-MEMS probe structure, and the guide plate-MEMS probe structure is made from the guide plate-MEMS probe structure template; the guide plate-MEMS probe structure template can be dissolved in the solution where the guide plate and the MEMS probe cannot be dissolved, and the guide plate-MEMS probe structure template is provided with a marker position, and the guide plate is provided with a coating convex.

The MEMS probe card and the guide plate-MEMS probe structure template are made by the guide board-MEMS probe structure template etching equipment, and the guide plate-MEMS probe structure template etching equipment is successively provided with a light source, a pinhole, a collimating lens, an x-direction slit expansion plate, a y-direction slit expansion plate, a first prism, a plane mirror, a second prism, a first image sensor, a controller and a laser array along the direction of light propagation.

The guide plate-MEMS probe structure template is made by using the guide plate-MEMS probe structure template etching equipment, including three steps:
Step a: x-direction positioning;
Step b: y-direction positioning;
Step c: Two-dimensional positioning.

BENEFICIAL EFFECTS

First, the invention discloses a MEMS probe card and it also includes a new manufacturing process of a MEMS probe card, including the structure of MEMS probe card, the etching equipment and method of guide plate-MEMS probe structure template, the probe positioning method of etching the guide plate-MEMS probe structure template, the manufacturing method of the guide plate-MEMS probe structure and the docking device and method of the guide plate-MEMS probe structure and the adapter layer. These key technologies coordinate with each other and are indispensable. As a whole, they can finally realize the manufacturing of submicron-sized MEMS probe cards.

Second, the invention discloses a guide plate-MEMS probe structure template etching equipment and etching method, which can produce a submicron-sized guide plate-MEMS probe structure template, and thus lay the equipment and method foundation for providing a new manufacturing method of the guide plate-MEMS probe structure; it should be noted that in this equipment, a magnifying lens can also be added between the plane mirror and the first image sensor to realize the imaging of the submicron-sized image in the micron-sized pixel imaging device; a reducing lens can be added between the laser array and the quasi-guide plate-MEMS probe structure template to realize the effect of submicron-sized etching with the non-submicron-sized laser array.

Third, the invention discloses a probe positioning method of the guide plate-MEMS probe structure template etching. By using this method, the probe coordinates can be positioned, thus laying a technical foundation for the docking of the guide plate-MEMS probe structure and the adapter layer.

Fourth, the invention discloses a method for making a guide plate-MEMS probe structure by using a guide plate-MEMS probe structure template. Because the size and position of the MEMS probe are limited in the template, the probe will not bend to contact another probe during the manufacturing process to cause manufacturing failure, which is conducive to the realization of the manufacturing of the MEMS probe card.

Fifth, the invention also designs a docking technology between the guide plate-MEMS probe structure and the adapter layer according to the unique process of the application, which divides the probe card into upper and lower parts, wherein the stiffener, PCB board and adapter layer constitute the upper part, and the guide plate-MEMS probe structure is the lower part. Through the docking device and method of the guide plate-MEMS probe structure and the adapter layer disclosed by the invention, the two parts are connected, and finally the manufacturing of the MEMS probe card is completed.

In the figures: 1 stiffener, 2 PCB board, 3 adapter layer, 4 guide plate, 5 MEMS probe, 6 quasi-guide plate-MEMS probe structure template, 7-1 light source, 7-2 pinhole, 7-3 collimating lens, 7-4 x-direction slit expansion plate, 7-5 y-direction slit expansion plate, 7-45-1 coaxial step roller, 7-45-2 pull wire, 7-45-3 slit plate, 7-6 first prism, 7-7 plane mirror, 7-8 second prism, 7-9 first image sensor, 7-10 controller, 7-11 laser array, 8-1 third prism, 8-2 objective lens, 8-3 second image sensor, 8-4 lifting platform, 8-5 bracket, 8-6 cylinder, 8-7 support plate, 8-8 two-dimensional translation platform.

SPECIFIC EMBODIMENT

The specific embodiments of the invention are further described in detail below with reference to the figures.

Specific Embodiment 1

The following is the implementation of the MEMS probe card.

Figure 1:
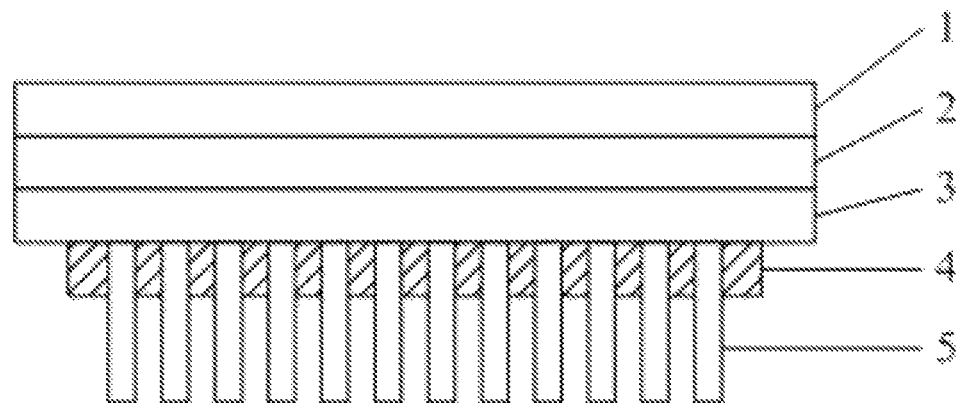
FIG. 1 is a schematic view of the MEMS probe card.

The structure of the MEMS probe card in this embodiment is shown in FIG. 1, and from top to bottom, the MEMS probe card comprises a stiffener 1, a PCB board 2, an adapter layer 3, a guide plate 4 and a MEMS probe 5; the stiffener 1 is used to increase the strength of MEMS probe card; the PCB board 2 is used to connect the testing machine and signal line; the adapter layer 3 is a medium between a PCB board 2 and a MEMS probe 5 for realizing a fixed adaptation of signals; the guide plate 4 is used to accommodate a MEMS probe 5; and the MEMS probe 5 is used to connect the tested wafer to realize the testing of the electrical properties of the wafer;

The guide plate 4 and the MEMS probe 5 jointly constitute a guide plate-MEMS probe structure, and the guide plate-MEMS probe structure is made from the guide plate-MEMS probe structure template; the guide plate-MEMS probe structure template can be dissolved in the solution where the guide plate 4 and the MEMS probe 5 cannot be dissolved, and the guide plate-MEMS probe structure template is provided with a marker position, and the guide plate 4 is provided with a coating convex.

Specific Embodiment 2

The following is an implementation of the guide plate-MEMS probe structure template etching equipment.

Figure 2:
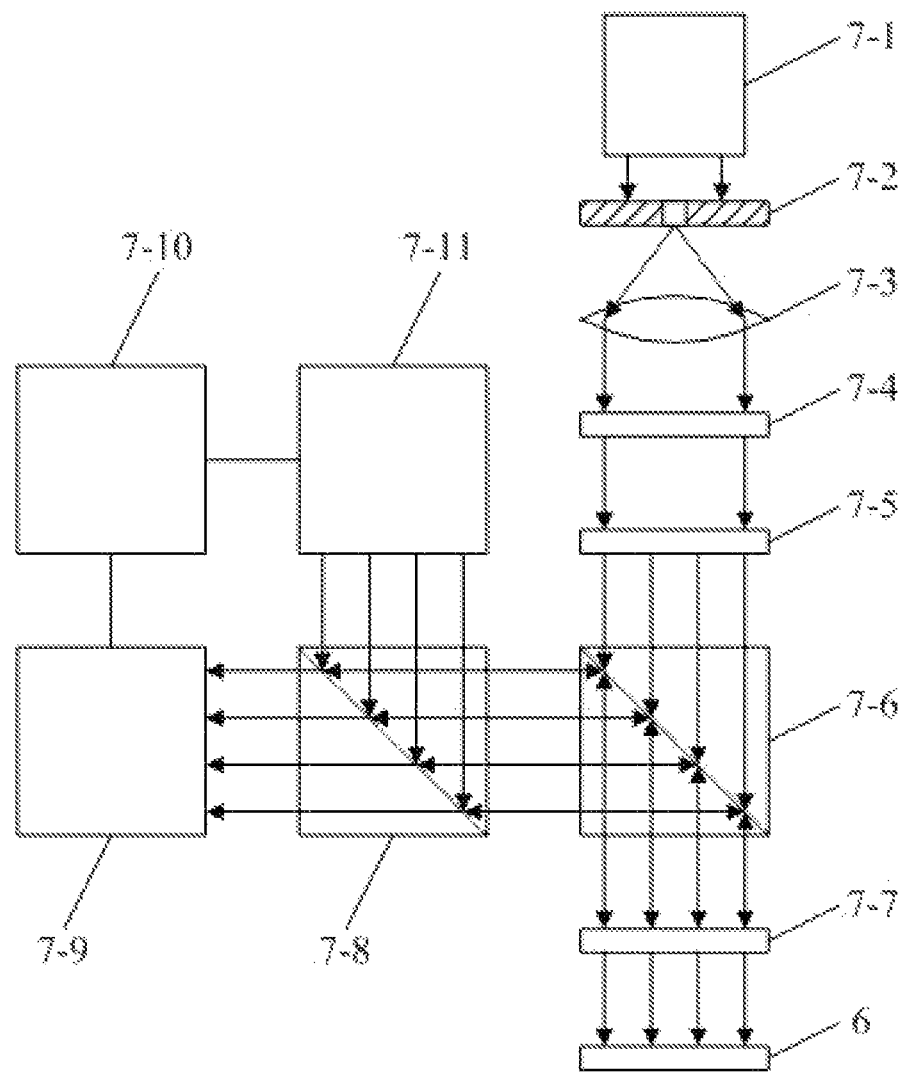
FIG. 2 is a schematic view of the guide plate-MEMS probe structure template etching equipment.

The structure of the guide plate-MEMS probe structure template etching equipment in this embodiment is shown in FIG. 2 and the guide plate-MEMS probe structure template etching equipment is successively provided with a light source 7-1, a pinhole 7-2, a collimating mirror 7-3, an x-direction slit expansion plate 7-4, a y-direction slit expansion plate 7-5, a first prism 7-6, a plane mirror 7-7, a second prism 7-8, a first image sensor 7-9, a controller 7-10 and a laser array 7-11 along the direction of light propagation;

The light beam emitted by the light source 7-1 passes through pinhole 7-2 to form a point light source, and the pinhole 7-2 is located at the focus of the collimating lens 7-3. The point light source passes through the collimating lens 7-3 to form parallel light, and the parallel light passes through the x-direction slit expansion plate 7-4 to form an x-direction stripe array, and the x-direction stripe array passes through the y-direction slit expansion plate 7-5 to form a point array, and the point array is transmitted through the first prism 7-6, reflected by the plane mirror 7-7, reflected by the first prism 7-6, transmitted by the second prism 7-8, and incident to the first image sensor 7-9 respectively. The first image sensor 7-9 is electrically connected with the controller 7-10 and the controller 7-10 controls the laser array 7-11 to send out laser beam, and the laser beam is reflected by the second prism 7-8 and the first prism 7-6 respectively and incident to the guide plate-MEMS probe structure template 6 without the plane mirror 7-7.

Specific Embodiment 3

The following is an implementation of the guide plate-MEMS probe structure template etching equipment.

Figure 3:
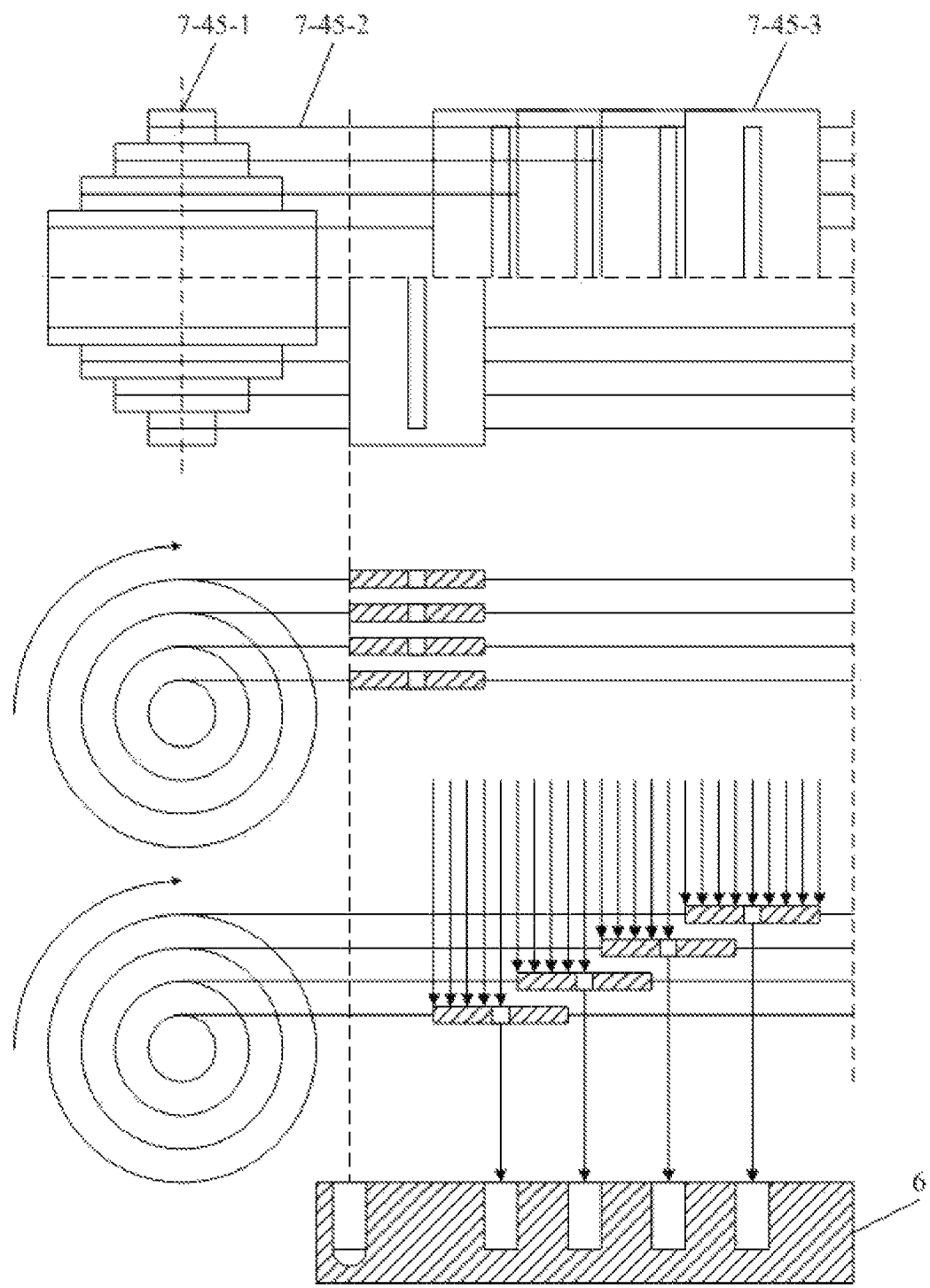
FIG. 3 is a schematic view of the slit expansion plate.

The structure of the guide plate-MEMS probe structure template etching equipment in this embodiment is shown in FIG. 2, and the guide plate-MEMS probe structure template etching equipment is further defined on the basis of specific embodiment 2:

The x-direction slit expansion plate 7-4 and the y-direction slit expansion plate 7-5 are placed vertically. The x-direction slit expansion plate 7-4 and the y-direction slit expansion plate 7-5 both comprise the coaxial step roller 7-45-1, the pull wire 7-45-2 and the slit plate 7-45-3. The coaxial step roller 7-45-1 is shown in FIG. 3;

The coaxial step roller 7-45-1 comprises rollers with different diameters arranged on the same axis. The rollers are arranged from small diameter to large diameter at the arithmetic progression and the first item is 2 times of the tolerance. A pull wire 7-45-2 is provided on each end of the roller and the pull wire 7-45-2 is connected to the slit plate 7-45-3. The coaxial step roller 7-45-1 is provided with an initial position. When the coaxial step roller 7-45-1 is located at the initial position, the slit plate 7-45-3 coincides with the direction of light propagation. At this time, the edge of the slit plate 7-45-3 is aligned with the marker position of the guide plate-MEMS probe structure template; after the coaxial step roller 7-45-1 rotates, the slit plates 7-45-3 spread out at different speeds from low speed to fast speed at the arithmetic progression and the first item is the same as the tolerance. After spreading out, the distance between two adjacent slit plates 7-45-3 is the same.

Specific Embodiment 4

The following is an implementation of the guide plate-MEMS probe structure template etching method.

Figure 4:
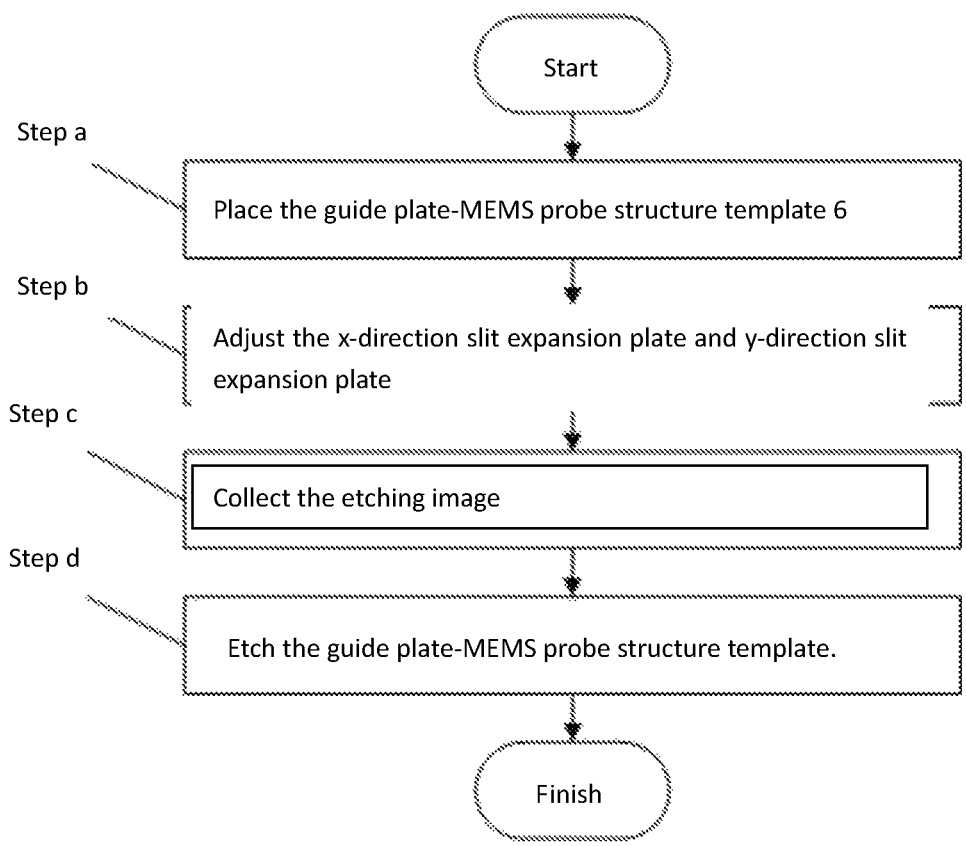
FIG. 4 is a flow chart of the etching method of the guide plate-MEMS probe structure template.

The flow chart of the guide plate-MEMS probe structure template etching method is shown in FIG. 4, and the guide plate-MEMS probe structure template etching method is implemented on the guide plate-MEMS probe structure template etching equipment in the embodiment 2 or embodiment 3. The method includes the following steps:

Step a: Place the guide plate-MEMS probe structure template 6. The marker position of the guide plate-MEMS probe structure template 6 is located at the edge of slit plate 7-45-3 when coaxial step roller 7-45-1 is located at the initial position;

Step b. Adjust the x-direction slit expansion plate 7-4 and y-direction slit expansion plate 7-5, and rotate the coaxial step roller 7-45-1 of the x-direction slit expansion plate 7-4 according to the distance between two adjacent MEMS probes in the x direction and ensure that the product of linear speed and rotation time is the distance between two adjacent MEMS probes in the x direction; rotate the coaxial step roller 7-45-1 of the y-direction slit expansion plate 7-5 according to the distance between two adjacent MEMS probes in the y direction and ensure that the product of linear speed and rotation time is the distance between two adjacent MEMS probes in the y direction;

Step c: Collect the etching image.

Install the plane mirror 7-7 and light the light source 7-1. The light beam emitted by the light source 7-1 passes through pinhole 7-2 to form a point light source, and the pinhole 7-2 is located at the focus of the collimating lens 7-3. The point light source passes through the collimating lens 7-3 to form parallel light, and the parallel light passes through the x-slit expansion plate 7-4 to form an x-stripe array, and the x-stripe array passes through the y-slit expansion plate 7-5 to form a point array, and the point array is transmitted through the first prism 7-6, reflected by the plane mirror 7-7, reflected by the first prism 7-6, transmitted by the second prism 7-8, and incident to the first image sensor 7-9 respectively;

Step d. Etch the guide plate-MEMS probe structure template.

Remove the plane mirror 7-7. The first image sensor 7-9 controls the laser array 7-11 to emit a laser beam according to the image collected in step c. The laser beam is reflected by the second prism 7-8 and the first prism 7-6 respectively, and incident on the surface of the guide plate-MEMS probe structure template 6 without the plane mirror 7-7 to realize etching.

Specific Embodiment 5

The following is an implementation of the probe positioning method of the guide plate-MEMS probe structure template etching.

Figure 5:
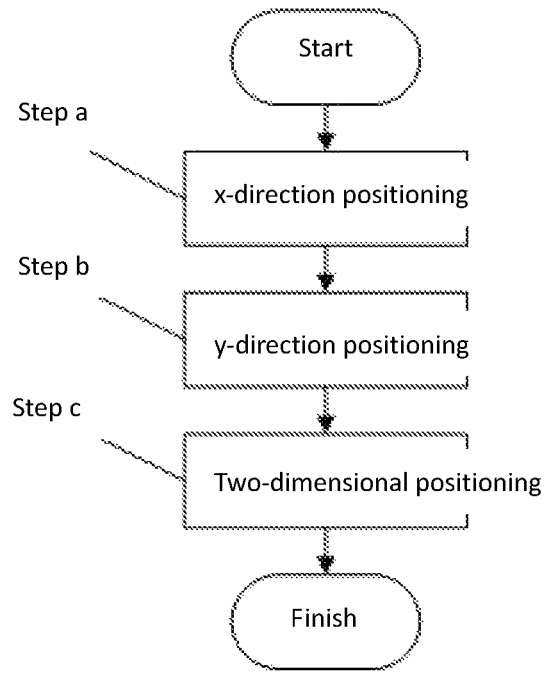
FIG. 5 is a flow chart of the probe positioning method of the guide plate-MEMS probe structure template etching.

The flow chart of the probe positioning method of the guide plate-MEMS probe structure template etching is shown in FIG. 5, and the probe positioning method of etching the guide plate-MEMS probe structure template etching is the key step before the implementation of the guide plate-MEMS probe structure template etching method described in the embodiment 4. The method includes the following steps:

Step a: x-direction positioning

For the x-direction slit expansion plate 7-4, the width of slit plate 7-45-3 is set as d1, the rotation angular speed of coaxial step roller 7-45-1 is set as w1, the rotation time is set as t1, and the radius of the smallest roller in coaxial step roller 7-45-1 is set as r1, then the distance between two adjacent MEMS probes is w1r1t1;

The distance between the slit nearest to the marker position of the quasi-guide plate-MEMS probe structure template 6 and the marker position is d1/2+w1r1t1;

Step b: y-direction positioning

For the y-direction slit expansion plate 7-5, the width of slit plate 7-45-3 is set as d2, the rotation angular speed of coaxial step roller 7-45-1 is set as w2, the rotation time is set as t2, and the radius of the smallest roller in coaxial step roller 7-45-1 is set as r2, then the distance between two adjacent MEMS probes is w2r2t2;

The distance between the slit nearest to the marker position of the quasi-guide plate-MEMS probe structure template 6 and the marker position is d2/2+w2r2t2;

Step c: Two-Dimensional Positioning.

The positioning of MEMS probes is realized by locating the distance between two adjacent MEMS probes in the x direction, the distance between the slit nearest to the marker position of the quasi-guide plate-MEMS probe structure template 6 and the marker position in the x direction, the distance between two adjacent MEMS probes in the y direction, and the distance between the slit nearest to the marker position of the quasi-guide plate-MEMS probe structure template 6 and the marker position in the y direction.

Specific Embodiment 6

The following is the implementation of the manufacturing method of the guide plate-MEMS probe structure.

Figure 6:
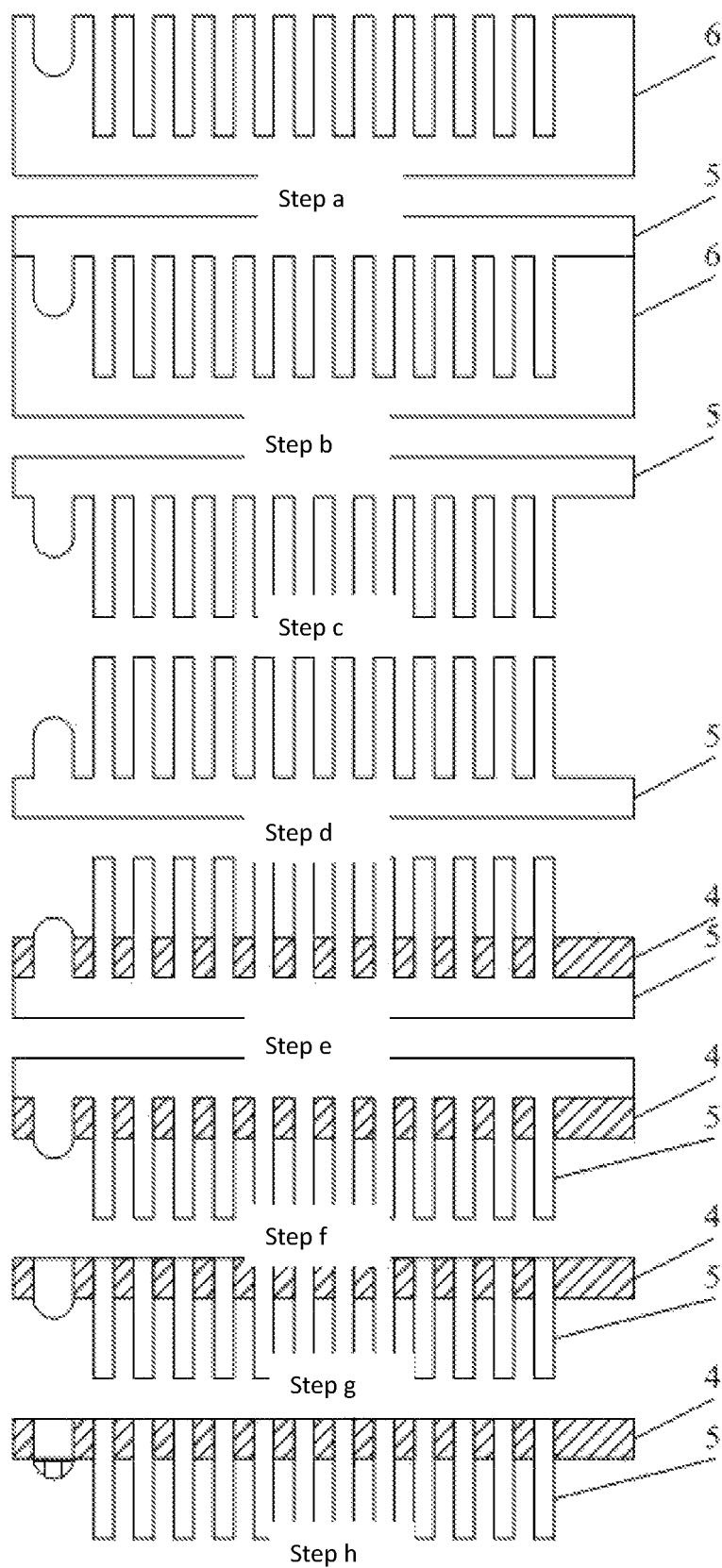
FIG. 6 is a flow chart of the manufacturing method of the guide plate-MEMS probe structure.

After the guide plate-MEMS probe structure template is etched, it is necessary to manufacture the guide plate-MEMS probe structure. The flow chart of the manufacturing method of the guide plate-MEMS probe structure is shown in FIG. 6, and the guide plate-MEMS probe structure manufacturing method includes the following steps:

Step a. Prepare the etched guide plate-MEMS probe structure template 6;

Step b. Fill the guide plate-MEMS probe structure template 6 with MEMS probe 5 material and cure;

Step c. Dissolve the guide plate-MEMS probe structure template 6 with solution, and keep the MEMS probe 5 material;

Step d. Turn the MEMS probe 5 material obtained in step c up and down;

Step e. Fill the gap of MEMS probe 5 material with guide plate 4 material and cure;

Step f. Turn the structure obtained in step e up and down;

Step g. Grind off the MEMS probe 5 material above the guide plate 4 material, so that the guide plate 4 material and the MEMS probe 5 material are exposed above at the same time, and obtain the guide plate-MEMS probe structure;

Step h. Coat the convex part of the guide plate 4 material corresponding to the marker position of the guide plate-MEMS probe structure template 6.

Specific Embodiment 7

The following is the implementation way of the docking device between the guide plate-MEMS probe structure and the adapter layer.

Figure 7:
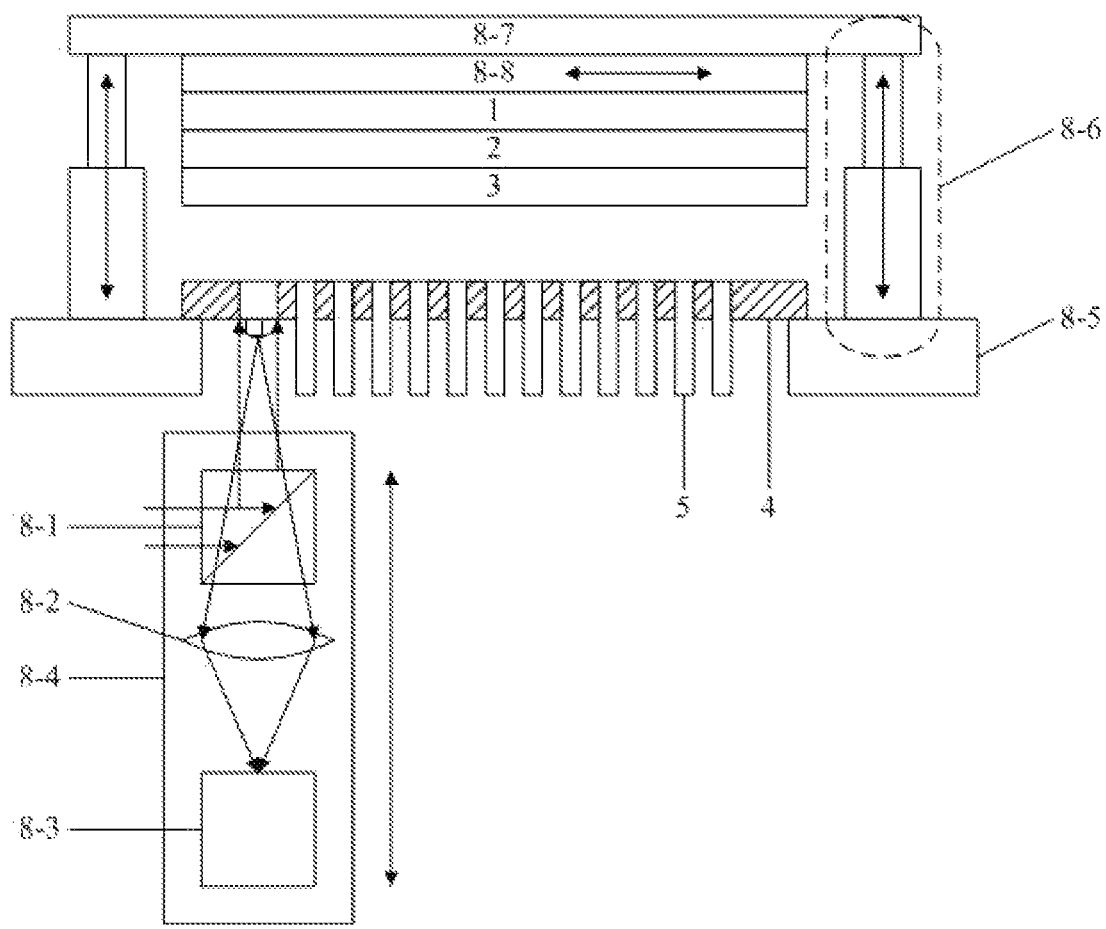
FIG. 7 is a schematic view of the docking device between the guide plate-MEMS probe structure and the adapter layer.

After the manufacturing of the guide plate-MEMS probe structure is finished, it is necessary to dock the guide plate-MEMS probe structure with the adapter layer to form a MEMS probe card. The docking device between the guide plate-MEMS probe structure and the adapter layer in this embodiment is shown in FIG. 7, and the docking device between the guide plate-MEMS probe structure and the adapter layer includes a third prism 8-1, an objective lens 8-2, a second image sensor 8-3, a lifting platform 8-4, a bracket 8-5, a cylinder 8-6, a support plate 8-7, and a two-dimensional translation platform 8-8;

The third prism 8-1, the objective lens 8-2 and the second image sensor 8-3 are located on the lifting platform 8-4, and move up and down with the lifting platform. The parallel light is incident horizontally, reflected by the third prism 8-1, and irradiated on the coated convex on the guide plate 4 to excite the fluorescent light, and then transmitted through the third prism 8-1, converged by the objective lens 8-2 and imaged on the second image sensor 8-3;

The bracket 8-5 is used to support the guide plate-MEMS probe structure, and the bracket 8-5 is also symmetrically provided with synchronous movement cylinder 8-6, and the cylinder 8-6 is installed with a support plate 8-7 on the top, and the support plate 8-7 is equipped with a two-dimensional translation platform 8-8 below, and the two-dimensional translation platform 8-8 can move two-dimensionally in the horizontal plane, and the two-dimensional translation platform 8-8 also has the heating function, which can make the structure composed of stiffener 1, PCB board 2 and adapter layer 3 pasted under the two-dimensional translation platform 8-8 fall off from the two-dimensional translation platform 8-8 through heating.

Specific Embodiment 8

The following is the implementation way of the docking method between the guide plate-MEMS probe structure and the adapter layer.

Figure 8:
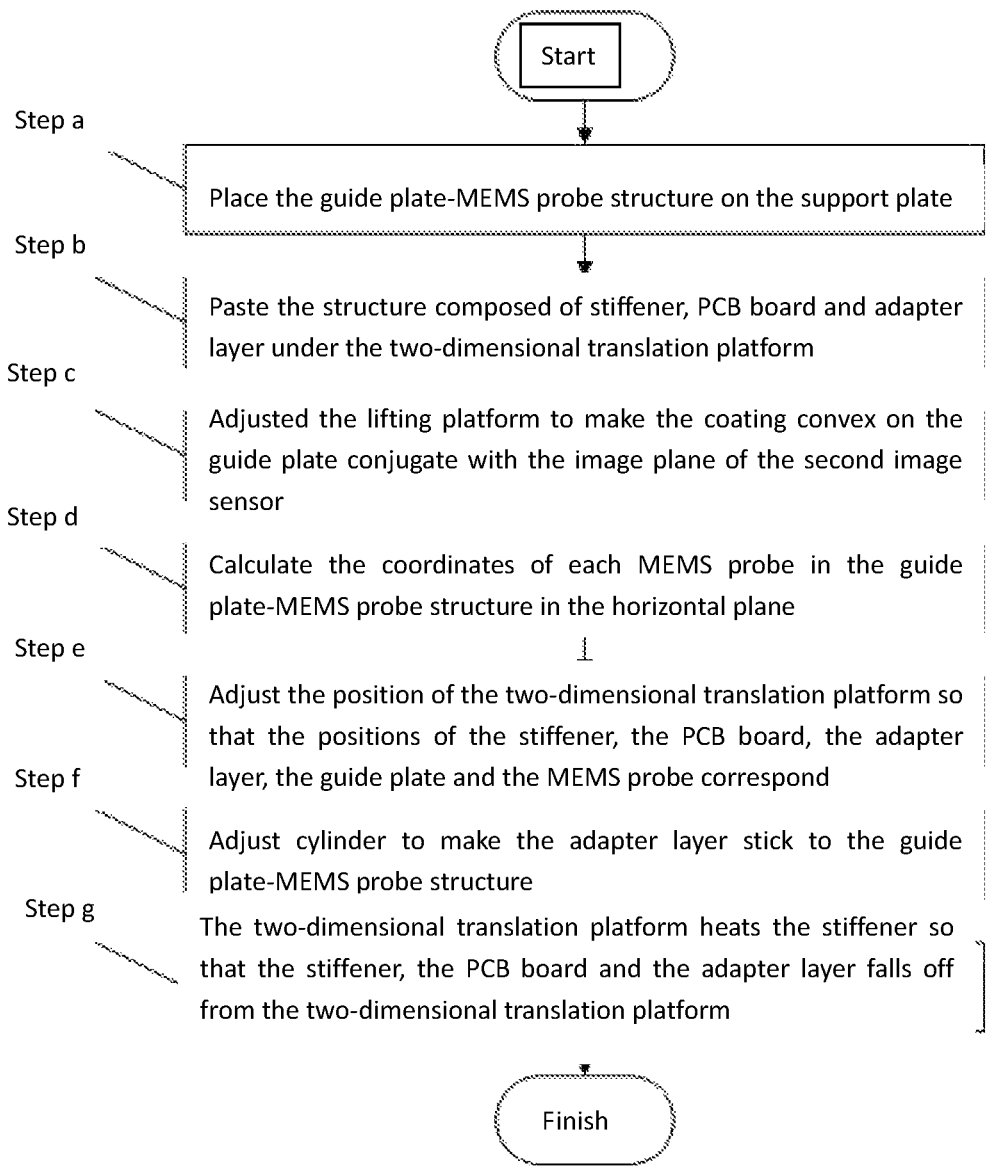
FIG. 8 is a flow chart of the docking method between the guide plate-MEMS probe structure and the adapter layer.

The flow chart of the docking method between the guide plate-MEMS probe structure and the adapter layer in this embodiment is shown in FIG. 8, and the docking method between the guide plate-MEMS probe structure and the adapter layer is implemented on the docking device between the guide plate-MEMS probe structure and the adapter layer in the embodiment 7. The method includes the following steps:

Step a. Place the guide plate-MEMS probe structure on the support plate 8-7;

Step b. Paste the structure composed of stiffener 1, PCB board 2 and adapter layer 3 under the two-dimensional translation platform 8-8;

Step c. The parallel light is incident horizontally, and the lifting platform 8-4 is adjusted according to the size of the light spot on the second image sensor 8-3, so that the coating convex on the guide plate 4 is conjugate with the image plane of the second image sensor 8-3, at this time, the light spot on the second image sensor 8-3 is the smallest;

Step d. Calculate the coordinates of each MEMS probe 5 in the guide plate-MEMS probe structure in the horizontal plane according to the position of the light spot on the second image sensor 8-3;

Step e. According to the coordinates of each MEMS probe 5 in the horizontal plane in step d, adjust the position of the two-dimensional translation platform 8-8 so that the positions of the stiffener 1, the PCB board 2, the adapter layer 3, the guide plate 4 and the MEMS probe 5 correspond;

Step f. Adjust cylinder 8-6 to make the adapter layer 3 stick to the guide plate-MEMS probe structure;

Step g. The two-dimensional translation platform 8-8 heats the stiffener 1 so that the structure composed of the stiffener 1, the PCB board 2 and the adapter layer 3 falls off from the two-dimensional translation platform 8-8.

It should be noted that in the above embodiments, as long as the technical solutions are not contradictory, they can be arranged and combined. Since those skilled in the art can exhaust all the results of permutation and combination according to the knowledge of permutation and combination mathematics learned in high school, these results are not listed one by one in this application, but it should be understood that every permutation and combination result is recorded in this application.

It should also be noted that the above embodiments are only illustrative illustrations of the present patent and do not limit its scope of protection. Those skilled in the art can also make partial changes to them, but as long as they do not exceed the spirit of the present patent, they are within the scope of protection of the present patent.

The invention claimed is:

1. A MEMS probe card comprises a stiffener (1), a PCB board (2), an adapter layer (3), a guide plate (4) and a MEMS probe (5) from top to bottom; the stiffener (1) is used to increase the strength of MEMS probe card; the PCB board (2) is used to connect a testing machine and signal line; the adapter layer (3) is a medium between a PCB board and the MEMS probe for realizing a fixed adaptation of signals; the guide plate (4) is used to accommodate the MEMS probe (5); and the MEMS probe (5) is used to connect a tested wafer to realize testing of electrical properties of the tested wafer;

wherein:

the guide plate (4) and the MEMS probe (5) jointly constitute a guide plate-MEMS probe structure, and the guide plate-MEMS probe structure is made from a guide plate-MEMS probe structure template; the guide plate-MEMS probe structure template can be dissolved in the solution where the guide plate (4) and the MEMS probe (5) cannot be dissolved, and the guide plate-MEMS probe structure template is provided with a marker position, and the guide plate (4) is provided with a coating convex;

the guide plate-MEMS probe structure template are made by a guide board-MEMS probe structure template etching equipment, and the guide plate-MEMS probe structure template etching equipment is successively provided with a light source (7-1), a pinhole (7-2), a collimating lens (7-3), an x-direction slit expansion plate (7-4), a y-direction slit expansion plate (7-5), a first prism (7-6), a plane mirror (7-7), a second prism (7-8), a first image sensor (7-9), a controller (7-10), and a laser array (7-11) along a direction of light propagation; and the light beam emitted by the light source (7-1) passes through pinhole (7-2) to form a point light source, and the pinhole (7-2) is located at the focus of the collimating lens (7-3); the point light source passes through the collimating lens (7-3) to form parallel light, and the parallel light passes through the x-direction slit expansion plate (7-4) to form an x-direction stripe array, and the x-direction stripe array passes through the y-direction slit expansion plate (7-5) to form a point array, and the point array is transmitted through the first prism (7-6), reflected by the plane mirror (7-7), reflected by the first prism (7-6), transmitted by the second prism (7-8), and incident to the first image sensor (7-9) respectively; the first image sensor (7-9) is electrically connected with the controller (7-10) and the controller (7-10) controls the laser array (7-11) to send out a laser beam, and the laser beam is reflected by the second prism (7-8) and the first prism (7-6) respectively and incident to the guide plate-MEMS probe structure template (6) without the plane mirror (7-7).

* * * * *